(12) United States Patent  
Mistretta et al.

(10) Patent No.: US 7,583,992 B2
(45) Date of Patent: Sep. 1, 2009

(54) MAGNETIC RESONANCE ANGIOGRAPHY WITH AUTOMATED VESSEL SEGMENTATION

(75) Inventors: Charles A. Mistretta, Madison, WI (US); Yousef Mazaheri, Madison, WI (US); Timothy J. Carroll, Chicago, IL (US); Jiang Du, Madison, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 48 days.

(21) Appl. No.: 10/485,433
(22) PCT Filed: Mar. 16, 2001
(86) PCT No.: PCT/US01/08477

§ 371 (c)(1),
(2), (4) Date: Sep. 22, 2004

(87) PCT Pub. No.: WO01/75469

PCT Pub. Date: Oct. 11, 2001

(65) Prior Publication Data
US 2005/0033159 A1 Feb. 10, 2005

Related U.S. Application Data

(60) Provisional application No. 60/193,088, filed on Mar. 30, 2000.

(51) Int. Cl.
*A61B 5/05* (2006.01)
(52) U.S. Cl. .................. 600/420; 600/419; 600/431; 324/306; 324/307; 324/308; 324/309
(58) Field of Classification Search .......... 600/407–480; 324/306–309; 382/128, 130; 424/9.4
See application file for complete search history.

(56) References Cited

U.S. PATENT DOCUMENTS

| 4,204,225 | A | 5/1980 | Mistretta |
| RE32,701 | E | 6/1988 | Moran |
| 5,368,033 | A * | 11/1994 | Moshfeghi ................. 600/419 |

(Continued)

FOREIGN PATENT DOCUMENTS

JP 11 151224 A 6/1999

OTHER PUBLICATIONS

Mazaheri Y, Carroll TJ, Mistretta CA, Korosec FR, Grist TM. Vessel Segmentation in 3D MR Angiography Using Time Resolved Acquisition Curves. Proc. Intl. Soc. Magn. Reson.*

(Continued)

*Primary Examiner*—Brian Casler
*Assistant Examiner*—Amanda L. Lauritzen
(74) *Attorney, Agent, or Firm*—Quarles & Brady LLP (57) ABSTRACT

A magnetic resonance angiogram (MRA) is acquired using a contrast enhancement method in which a series of NMR images are rapidly acquired during a time resolved phase of the examination in which the contrast bolus makes a first pass through the arteries and veins. Arterial and venous voxels are automatically identified in the images using either of two disclosed methods. The signals from identified arterial voxels are used to produce an arterial contrast enhancement reference curve that is used to segment arterial voxels by a correlation process. Venous voxels are segmented in the same manner using a calculated venous contrast enhancement reference curve.

16 Claims, 7 Drawing Sheets

U.S. PATENT DOCUMENTS

| | | | |
|---|---|---|---|
| 5,417,213 | A | 5/1995 | Prince |
| 5,792,056 | A * | 8/1998 | Prince .................. 600/420 |
| 5,928,148 | A * | 7/1999 | Wang et al. ............. 600/420 |
| 6,073,042 | A * | 6/2000 | Simonetti .............. 600/420 |
| 6,192,264 | B1 * | 2/2001 | Foo et al. .............. 600/413 |
| 6,377,835 | B1 * | 4/2002 | Schoenberg et al. ..... 600/419 |
| 6,381,486 | B1 * | 4/2002 | Mistretta et al. ....... 600/420 |
| 6,556,856 | B1 * | 4/2003 | Mistretta et al. ....... 600/420 |
| 6,597,938 | B2 * | 7/2003 | Liu .................... 600/420 |
| 6,639,211 | B1 * | 10/2003 | Anand et al. .......... 250/282 |
| 6,745,066 | B1 * | 6/2004 | Lin et al. ............. 600/425 |
| 6,925,321 | B2 * | 8/2005 | Stefancik et al. ...... 600/419 |
| 7,113,631 | B2 * | 9/2006 | Vaillant et al. ....... 382/154 |
| 2004/0096088 | A1 * | 5/2004 | Kohle ................. 382/128 |
| 2007/0010731 | A1 * | 1/2007 | Mistretta ............. 600/407 |
| 2007/0031019 | A1 * | 2/2007 | Lesage et al. ......... 382/131 |
| 2007/0165927 | A1 * | 7/2007 | Muradyan et al. ....... 382/128 |
| 2007/0167731 | A1 * | 7/2007 | Taxt et al. ........... 600/410 |
| 2007/0249912 | A1 * | 10/2007 | Tek ................... 600/300 |

OTHER PUBLICATIONS

NJ Taylor, IJ Rowland, SF Tanner, MO Leach. A Rapid Interleaved Method for Measuring Signal Intensity Curves in Both Blood and Tissue during Contrast Agent Administration. MRM 30: 744-749 (1993).*

G Riedy, X Golay, ER Melham. Three-dimensional isotropic contrast-enhanced MR angiography of the carotid artery using sensitivity-encoding and random elliptic centric k-space filling: technique optimization. Neuroradiology 47: 668-673 (2005).*

Du J, Mazaheri Y, Carroll TJ, Esparza Coss E, Grist TM, Mistretta CA. Automated Region-Specific VTRAC Segmentation in Peripheral MRA. Proc. Intl. Soc. Mag. Reson. Med. 8 (2000).*

Strecker R, Lehnhardt S, Klisch J, Hennig J. Functional MRA Combining 2D MR DSA and Correlation Analysis. Proc. Intl. Soc. Mag. Reson. Med. 7 (1999).*

M. Bock et al.: Artery-Vein Separation in 3D Contrast Enhanced Pulmonary MRA Using Correlation Analysis; Proc. of International Society for Magnetic Resonance In Medicine, Seventh Scientific Meeting and Exhibition, Philadelphia, PA May 22-28, 1999, vol. 1, p. 486; conference Abstract.

R. Strecker et al.: Functional MRI Combining 2D MR DSA And Correlation Analysis; Proc. of International Society for Magnetic Resonance In Medicine, Seventh Scientific Meeting and Exhibition, Philadelphia, PA May 22-28, 1999, vol. 1, p. 484; conference Abstract.

J. Du et al.: Automated Region-Specific VTRAC Segmentation in Peripheral MRA; Proc. of International Society for Magnetic Resonance In Medicine, Eighth Scientific Meeting and Exhibition, Denver CO, Apr. 1-7, 2000, vol. 3, p. 1807; conference Abstract.

* cited by examiner

MAGNETIC RESONANCE ANGIOGRAPHY WITH AUTOMATED VESSEL SEGMENTATION

CROSS-REFERENCE TO RELATED APPLICATIONS

This application claims the benefit of U.S. Provisional Application No. 60/193,088, filed on Mar. 30, 2000.

BACKGROUND OF THE INVENTION

The field of the invention is magnetic resonance angiography ("MRA"), and particularly, studies of the human vasculature using contrast agents which enhance the NMR signals.

Diagnostic studies of the human vasculature have many medical applications. X-ray imaging methods such as digital subtraction angiography ("DSA") have found wide use in the visualization of the cardiovascular system, including the heart and associated blood vessels. Images showing the circulation of blood in the arteries and veins of the kidneys and the carotid arteries and veins of the neck and head have immense diagnostic utility. Unfortunately, however, these x-ray methods subject the patient to potentially harmful ionizing radiation and often require the use of an invasive catheter to inject a contrast agent into the vasculature to be imaged.

One of the advantages of these x-ray techniques is that image data can be acquired at a high rate (i.e. high temporal resolution) so that a sequence of images may be acquired during injection of the contrast agent. Such "dynamic studies" enable one to select the image in which the bolus of contrast agent is flowing through the vasculature of interest. Earlier images in the sequence may not have sufficient contrast in the suspect vasculature, and later images may become difficult to interpret as the contrast agent reaches veins and diffuses into surrounding tissues. Subtractive methods such as that disclosed in U.S. Pat. No. 4,204,225 entitled "Real-Time Digital X-ray Subtraction Imaging" may be used to significantly enhance the diagnostic usefulness of such images.

Magnetic resonance angiography (MRA) uses the nuclear magnetic resonance (NMR) phenomenon to produce images of the human vasculature.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, $M_z$, may be rotated, or "tipped", into the x-y plane to produce a net transverse magnetic moment $M_t$. A signal is emitted by the excited spins, and after the excitation signal $B_1$ is terminated, this signal may be received and processed to form an image.

When utilizing these signals to produce images, magnetic field gradients ($G_x$ $G_y$ and $G_z$) are employed. Typically, the region to be imaged is scanned by a sequence of measurement cycles in which these gradients vary according to the particular localization method being used. Each measurement is referred to in the art as a "view" and the number of views determines the resolution of the image. The resulting set of received NMR signals, or views, are digitized and processed to reconstruct the image using one of many well known reconstruction techniques. The total scan time is determined in part by the number of measurement cycles, or views, that are acquired for an image, and therefore, scan time can be reduced at the expense of image resolution by reducing the number of acquired views.

MR angiography (MRA) has been an active area of research. Two basic techniques have been proposed and evaluated. The first class, time-of-flight (TOF) techniques, consists of methods which use the motion of the blood relative to the surrounding tissue as a means for differentiating the NMR signal amplitude. The most common approach is to exploit the differences in signal saturation that exist between flowing blood and stationary tissue. Flowing blood, which is moving through the excited region, is continually refreshed by spins experiencing fewer RF excitation pulses and is, therefore, less saturated. The result is the desired image contrast between the high-signal blood and the low-signal stationary tissues.

MR methods have also been developed that encode motion into the phase of the acquired NMR signal as disclosed in U.S. Pat. No. Re. 32,701. These form the second class of MRA techniques, which are known as phase contrast (PC) methods. Currently, most PC MRA techniques acquire two images, with each image having a different sensitivity to the same spin motion. Angiographic images are then obtained by forming either the phase difference or complex difference between the pair of velocity-encoded images. Phase contrast MRA techniques have been extended so that they are sensitive to velocity components in all three orthogonal directions.

To enhance the diagnostic capability of MRA a contrast agent such as gadolinium can be injected into the patient prior to the MRA scan. As described in U.S. Pat. No. 5,417,213 the trick with this contrast enhanced (CE) MRA method is to acquire the central k-space views at the moment the bolus of contrast agent is flowing through the vasculature of interest. Collection of the central lines of k-space during peak arterial enhancement is key to the success of a CE-MRA exam. If the central lines of k-space are acquired prior to the arrival of contrast, severe image artifacts can limit the diagnostic information in the image. Alternatively, arterial images acquired after the passage of the peak arterial contrast are obscured by the enhancement of veins. In many anatomic regions, such as the carotid or renal arteries, the separation between arterial and venous enhancement can be as short as 6 seconds.

The short separation time between arterial and venous enhancement dictates the use of acquisition sequences of either low spatial resolution or very short repetition times (TR). Short TR acquisition sequences severely limit the signal-to-noise ratio (SNR) of the acquired images relative to those exams in which longer TRs are possible. The rapid acquisitions required by first pass CE-MRA methods thus impose an upper limit on either spatial or temporal resolution. An additional detrimental effect of rapid imaging of the first pass of the bolus of contrast is the spurious modulation of k-space data resulting from the shape of the bolus of contrast. Current CE-MRA exams are of immense clinical utility, but due to the temporal-spatial limitations, they still fall short of x-ray DSA, the current "gold standard".

Ideally, angiograms should be acquired with techniques which allow longer scan times, after the first pass of the contrast bolus. For example, intravascular contrast agents can provide significant signal enhancement of the blood pool for over one hour. Images acquired after the first pass of the contrast agent in the so called "steady state" portion of the examination have the advantages of providing SNR and resolution increases limited only by patient motion. Even images acquired using currently available extravascular agents, which show only weak decay of plasma T1 shortening, may be improved by longer acquisitions acquired after the first pass of the bolus. Steady-state images permit excellent vessel delineation, although venous enhancement can severely limit arterial visualization reprojection images.

Clearly, an acquisition method which combines the excellent arterial-venous separation seen in first pass CE-MRA with the high resolution, high SNR images acquired in the steady-state is desirable. One approach is to acquire an angiogram without regard for the venous enhancement, and then remove the venous signal as a post-processing step. These venous removal techniques, which are referred to as vessel "segmentation", have been attempted by several researchers. Current methods of vessel segmentation, however, have proven to be of limited usefulness partially due to the difficulty in determining which voxels are artery and which are vein based solely on a spatial/geometric analysis of the vessels, or an analysis of their signal intensities.

SUMMARY OF THE INVENTION

The present invention is an automated method for segmenting vessels in time resolved, contrast enhanced magnetic resonance angiography. More specifically, a time course series of images is acquired with an MRI system during the first pass of a contrast agent; the images are divided into regions; arterial and venous contrast enhancement reference curves are automatically calculated for each region; and the voxels in each region are segmented into arterial and venous by comparing their signal over the time course series with the contrast enhancement reference curves.

In one embodiment of the invention contrast enhancement reference curves are produced automatically by producing a mean transit time image which indicates the time during the acquisition when each image voxel reaches its peak signal magnitude; producing a histogram from the mean transit time image; locating arterial and venous peaks in the histogram; selecting those image voxels having a mean transit time corresponding to the arterial peak as arterial voxels; and selecting those image voxels having a mean transit time corresponding to the venous peak as venous voxels.

In another embodiment of the invention contrast enhancement reference curves are produced by an automatic method in which arterial voxels are first identified as those which have maximum slope in their signals during a contrast arrival time interval; and venous voxels are identified by producing a contrast arrival time histogram and selecting those voxels with the same contrast arrival time as the peak in the histogram.

A general object of the invention is to automate the two-dimensional correlation method for segmenting contrast enhanced images. Rather than manually selecting venous and arterial voxels from which contrast enhancement reference curves are computed, these voxels are automatically selected.

Another object of the invention is to more accurately produce contrast enhancement reference curves for correlation segmentation of images. The contrast agent arrival time is usually different at different locations in the acquired images. This is particularly true if the field of view is large and encompasses vasculature from widely separated parts of the anatomy. The present invention divides the field of view into a plurality of regions and the contrast enhancement reference curves are automatically produced for each region. This enables a more accurate segmentation of arteries, veins and background tissues in each region.

The foregoing and other objects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims herein for interpreting the scope of the invention.

DESCRIPTION OF THE PREFERRED EMBODIMENT

Figure 1:
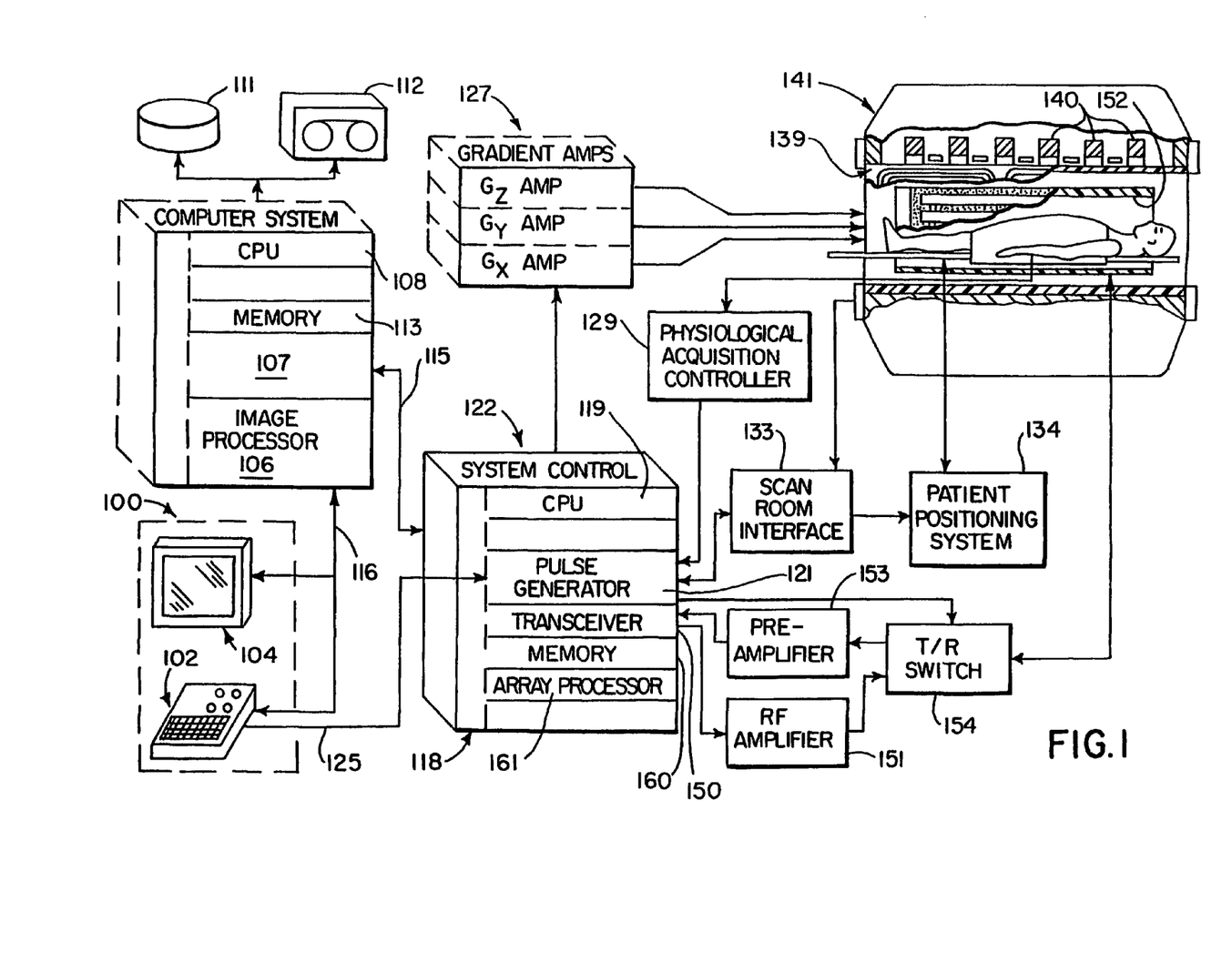
FIG. 1 is a block diagram of an MRI system which employs the present invention.

Referring first to FIG. 1, there is shown the major components of a preferred MRI system which incorporates the present invention. The operation of the system is controlled from an operator console 100 which includes a keyboard and control panel 102 and a display 104. The console 100 communicates through a link 116 with a separate computer system 107 that enables an operator to control the production and display of images on the screen 104. The computer system 107 includes a number of modules which communicate with each other through a backplane. These include an image processor module 106, a CPU module 108 and a memory module 113, known in the art as a frame buffer for storing image data arrays. The computer system 107 is linked to a disk storage 111 and a tape drive 112 for storage of image data and programs, and it communicates with a separate system control 122 through a high speed serial link 115.

The system control 122 includes a set of modules connected together by a backplane. These include a CPU module 119 and a pulse generator module 121 which connects to the operator console 100 through a serial link 125. It is through this link 125 that the system control 122 receives commands from the operator which indicate the scan sequence that is to be performed. The pulse generator module 121 operates the system components to carry out the desired scan sequence. It produces data which indicates the timing, strength and shape of the RF pulses which are to be produced, and the timing and length of the data acquisition window. The pulse generator module 121 connects to a set of gradient amplifiers 127, to indicate the timing and shape of the gradient pulses to be produced during the scan. The pulse generator module 121 also receives patient data from a physiological acquisition controller 129 that receives signals from a number of different sensors connected to the patient, such as ECG signals from electrodes or respiratory signals from a bellows. And finally, the pulse generator module 121 connects to a scan room interface circuit 133 which receives signals from various sensors associated with the condition of the patient and the magnet system. It is also through the scan room interface circuit 133 that a patient positioning system 134 receives commands to move the patient to the desired position for the scan.

The gradient waveforms produced by the pulse generator module 121 are applied to a gradient amplifier system 127 comprised of $G_x$, $G_y$, and $G_z$ amplifiers. Each gradient amplifier excites a corresponding gradient coil in an assembly generally designated 139 to produce the magnetic field gradients used for position encoding acquired signals. The gradient coil assembly 139 forms part of a magnet assembly 141 which includes a polarizing magnet 140 and a whole-body RF coil 152. A transceiver module 150 in the system control 122 produces pulses which are amplified by an RF amplifier 151 and coupled to the RF coil 152 by a transmit/receive switch 154. The resulting signals radiated by the excited nuclei in the patient may be sensed by the same RF coil 152 and coupled through the transmit/receive switch 154 to a preamplifier 153. The amplified NMR signals are demodulated, filtered, and digitized in the receiver section of the transceiver 150. The transmit/receive switch 154 is controlled by a signal from the pulse generator module 121 to electrically connect the RF amplifier 151 to the coil 152 during the transmit mode and to connect the preamplifier 153 during the receive mode. The transmit/receive switch 154 also enables a separate RF coil (for example, a head coil or surface coil) to be used in either the transmit or receive mode.

The NMR signals picked up by the RF coil 152 are digitized by the transceiver module 150 and transferred to a memory module 160 in the system control 122. When the scan is completed and an entire array of data has been acquired in the memory module 160, an array processor 161 operates to Fourier transform the data into an array of image data. This image data is conveyed through the serial link 115 to the computer system 107 where it is stored in the disk memory 111. In response to commands received from the operator console 100, this image data may be archived on the tape drive 112, or it may be further processed by the image processor 106 and conveyed to the operator console 100 and presented on the display 104.

Figure 2:
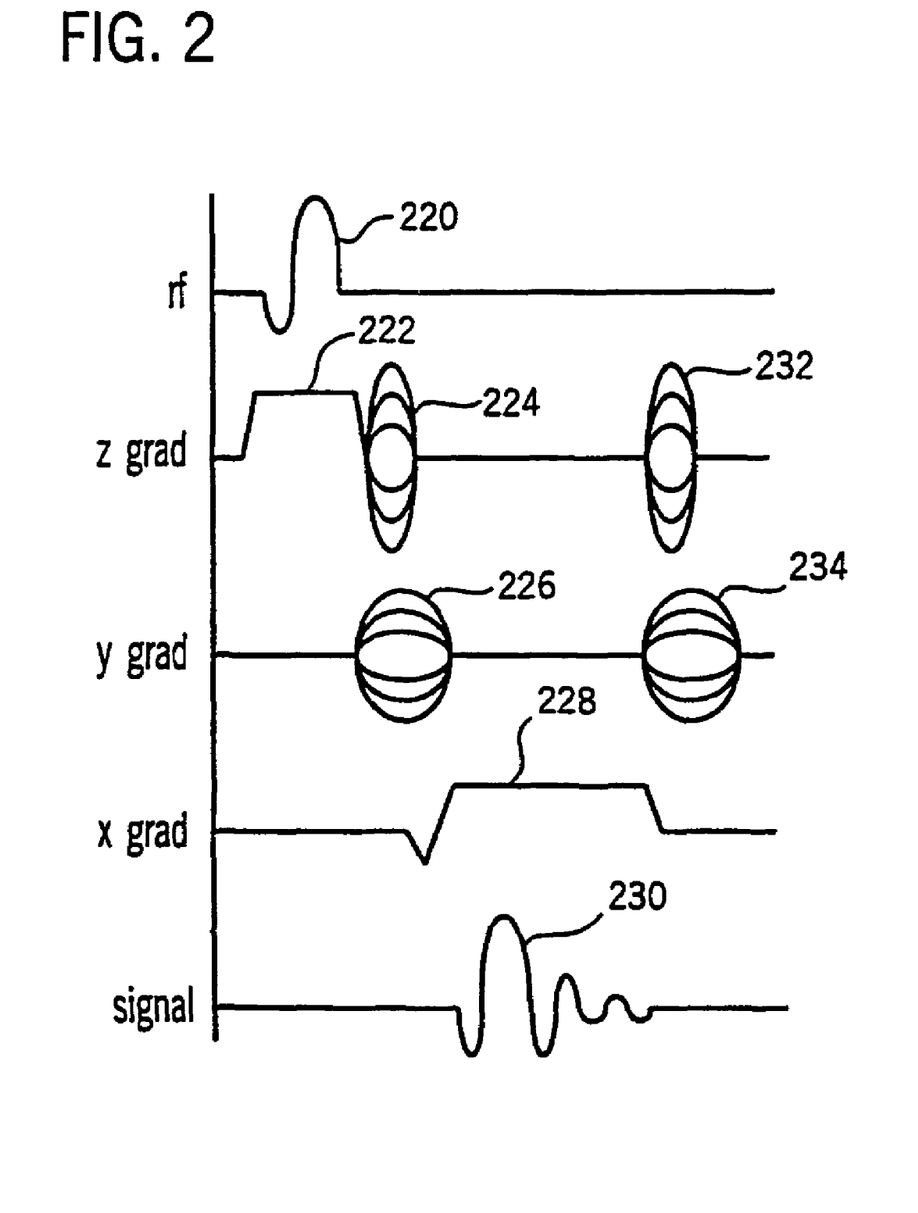
FIG. 2 is a graphic representation of the pulse sequence employed in the preferred embodiment of the invention.

Although the present invention can be used with a number of different pulse sequences, the preferred embodiment of the invention employs a 3D gradient recalled echo pulse sequence depicted in FIG. 2. The pulse sequence "3dfgre" available on the General Electric 1.5 Tesla MR scanner sold under the trademark "SIGNA" with revision level 5.5 system software was used. It was modified to collect data from multiple volumes so that the k-space sampling patterns described below can be practiced.

Referring particularly to FIG. 2, an RF excitation pulse 220 having a flip angle of 60° is produced in the presence of a slab select gradient pulse 222 to produce transverse magnetization in the 3D volume of interest as taught in U.S. Pat. No. 4,431,968. This is followed by a phase encoding gradient pulse 224 directed along the z axis and a phase encoding gradient pulse 226 directed along the y axis. A readout gradient pulse 228 directed along the x axis follows and a partial echo (60%) NMR signal 230 is acquired and digitized as described above. After the acquisition, rewinder gradient pulses 232 and 234 rephase the magnetization before the pulse sequence is repeated as taught in U.S. Pat. No. 4,665,365.

Figure 3:
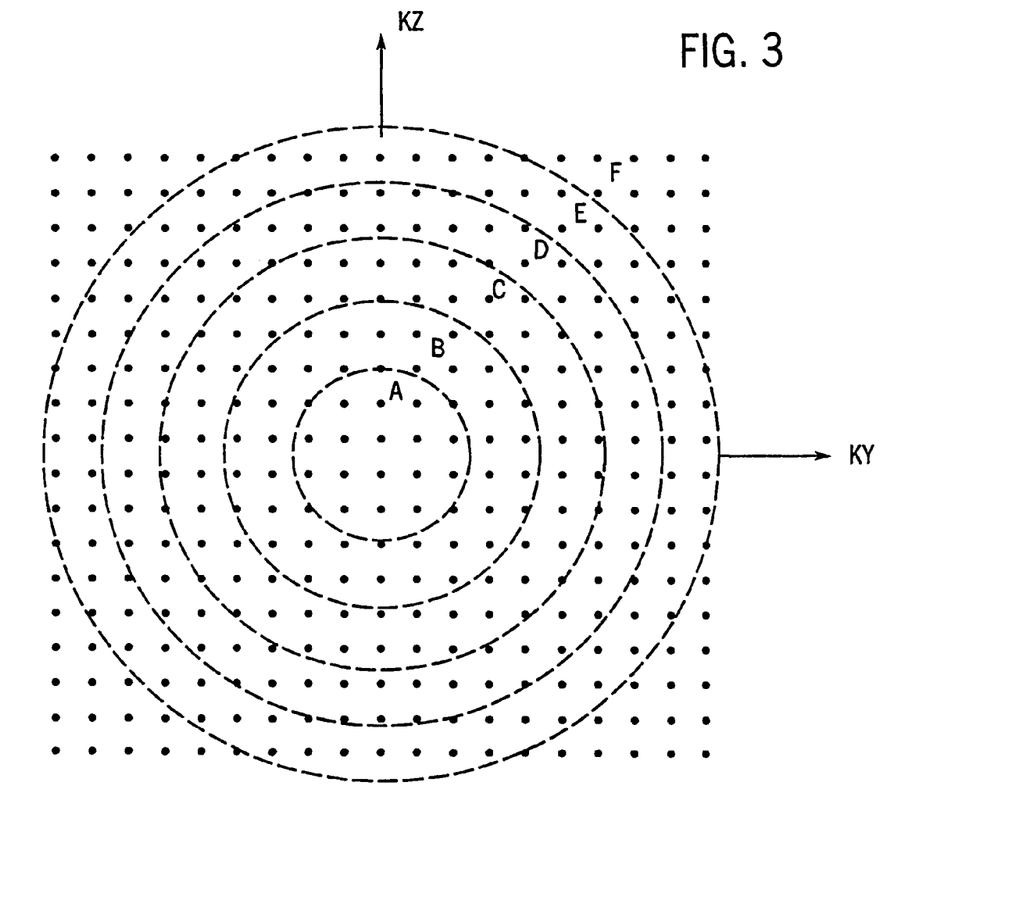
FIG. 3 is a graphic representation of k-space from which data is sampled when practicing the preferred embodiment of the invention.

As is well known in the art, the pulse sequence is repeated and the phase encoding pulses 224 and 226 are stepped through a series of values to sample the 3D k-space depicted in FIG. 3. In the preferred embodiment sixteen phase encodings are employed along the z axis and 128 phase encodings are employed along the y axis. For each particular y phase encoding, therefore, sixteen acquisitions with sixteen different z phase encodings are performed to sample completely along the $k_z$ axis. This is repeated 128 times with 128 different y phase encodings to sample completely along the $k_y$ axis. As will become apparent from the discussion below, the order in which this sampling is performed is important.

Sampling along the $k_x$ axis is performed by sampling the NMR echo signal 230 in the presence of the readout gradient pulse 228 during each pulse sequence. It will be understood by those skilled in the art that only a partial sampling along the $k_x$ axis is performed and the missing data is computed using a homodyne reconstruction or by zero filling. This enables the echo time (TE) of the pulse sequence to be shortened to less than 1.8 to 2.0 ms. and the pulse repetition rate (TR) to be shortened to less than 10.0 msecs.

The implementation of the present invention can be broken down into three parts: image acquisition; voxel characterization; and image reconstruction. Each part will now be discussed.

Image Acquisition

The image acquisition steps are a modification of the 3D MRA dynamic study disclosed in U.S. Pat. No. 5,713,358 issued Feb. 3, 1998 and entitled "Method for Producing A Time-Resolved Series of 3D Magnetic Resonance Angiograms During the First Passage of Contrast Agent". The present method circumvents the usual spatial-temporal constraints by acquiring data at a high temporal resolution and low spatial resolution in one phase of the acquisition, the "time resolved phase", and acquiring data at a low temporal resolution and high spatial resolution in a separate, "steady-state phase" of the acquisition.

Figure 5:
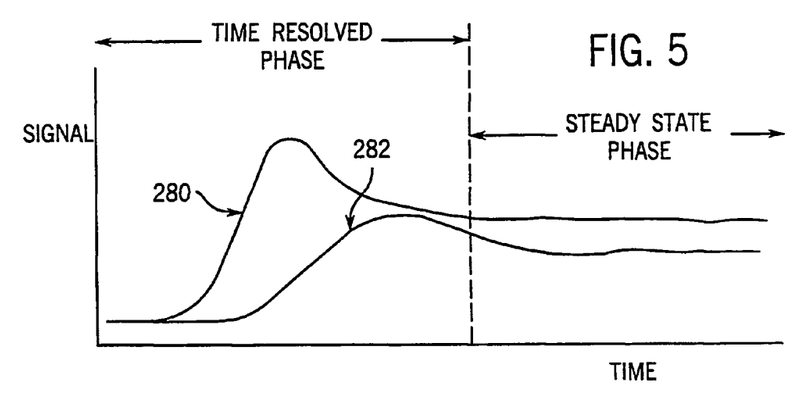
FIG. 5 is a graphic representation of typical arterial and verious enhancement curves produced when practicing the present invention.

When a contrast agent is injected into the patient the bolus flows into the ROI being imaged and sharply enhances the signal of arterial blood first as illustrated by curve 280 in FIG. 5. Shortly thereafter venous blood is enhanced as indicated by curve 282, and then the signal from both arterial and venous blood settles into a steady state of moderate enhancement for a relatively long period of time. The acquisition of NMR data according to the present invention is divided into two phases, a "time resolved phase" in which low to moderate resolution images are acquired at a high image frame rate, and a "steady state phase" in which high resolution, low noise image data is acquired at a low image frame rate.

Referring particularly to FIG. 3, in the preferred embodiment the k-space to be sampled is divided into six segments, or regions, designated "A-F". The boundaries of these regions are concentric about the origin of $k_z$-$k_y$ space and a central region "A" occupies the central k-space region. As is well known in the art, the "central" samples of k-space contain most of the information which determines overall image contrast, whereas the "peripheral" k-space samples contribute detail to the reconstructed image, such as vessel edges.

Figure 4:
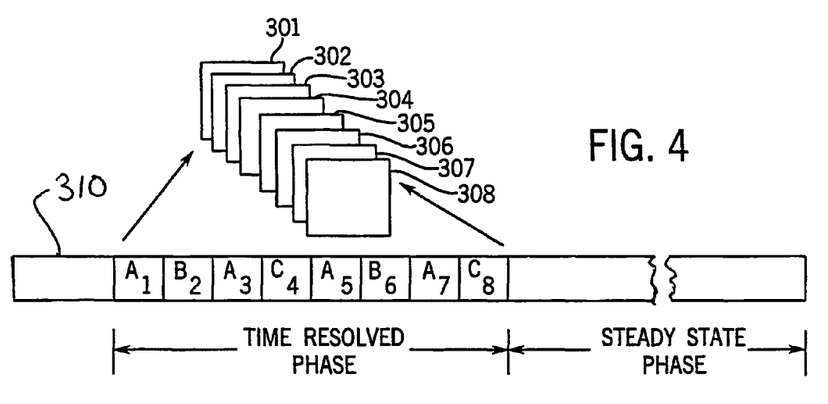
FIG. 4 is a graphic representation of the order in which the k-space of FIG. 3 is sampled.

The order in which k-space is sampled in the preferred embodiment of the invention is shown in FIG. 4. The first phase of the acquisition produces segments 1 through 8 which are reconstructed using an appropriate interpolation scheme and fast Fourier transform to form image frames 301 through 308 in a time course series of images. The signal magnitude (S) at each voxel in the images 301-308 is calculated from the complex I and Q values:

$$S=\sqrt{I^2+Q^2}.$$

The images 301-308 are of lower resolution than the final image, but their high temporal resolution allows for arterial and venous signal-versus-time contrast enhancement reference curves 280 and 282 to be produced as will be described below. Other data acquisition pulse sequences and k-space sampling methods may also be used during the time resolved phase of the scan. The guiding principle is that image frames are acquired at a sufficiently high temporal resolution that the contrast enhancement reference curves 280 and 282 are sufficiently distinctive from each other.

After the first pass of the contrast bolus, high resolution image frames are acquired during a steady-state phase of the acquisition. Since the contrast agent present in the blood is changing very slowly with time, it is possible to scan for a much longer time than that permitted by first pass bolus dynamics. Therefore, in the high resolution, steady-state phase of the acquisition, all segments of k-space are acquired using a high spatial resolution acquisition. The pulse sequence used may be the same as that used during the time resolved phase described above, or a different pulse sequence may be used. Multiple image frames are acquired and the SNR is increased at a rate of $\sqrt{N}$, where N is the number of acquired image frames which are averaged. The steady-state acquisition need not be time-resolved, but instead has high resolution and much higher SNR at the cost of both arterial and venous opacification.

Many variations are possible from the preferred data acquisition procedure described above. Other low resolution, high speed NMR pulse sequences can be used during the time resolved phase, and different NMR pulse sequences can be used during the steady-state phase. For example, spiral pulse sequences such as those described in U.S. Pat. No. 4,748,410, and projection acquisitions such as that described in co-pending U.S. patent application Ser. No. 09/314,226, filed on May 18, 1999 and entitled "Phase Contrast Imaging Using Interleaved Projection Data" may be used during the time resolved phase. The pulse sequence may be switched to another pulse sequence during the steady-state phase, or the same pulse sequence may be used in modified form. For example, the sampling of k-space along the readout gradient axis may be limited to a central region of k-space during the time resolved phase to shorten the TR period and thereby further increase the time resolution. This same pulse sequence may be used during the steady-state phase with a much larger range of k-space sampling along the readout gradient axis to improve image resolution.

Variations are also possible in the segmentation of k-space and the order in which the segments are acquired. In one alternative embodiment, for example, the central segment A is set to a size such that only the A segment need be acquired during the time resolved phase. Such "key hole" acquired images must have a resolution sufficient to produce a contrast enhancement curve for each voxel therein with the required time and spatial resolution.

In some applications it is desirable to acquire baseline NMR data which indicates signal strength prior to contrast arrival. As shown in FIG. 4, a baseline acquisition phase 310 occurs before the time resolved phase and one or more image frames are acquired using the same pulse sequence and high resolution sampling as during the steady state phase. A baseline image is reconstructed from this acquired NMR data which indicates the signal from arteries, veins and background tissues prior to arrival of any contrast agent. This baseline image may be subtracted from later acquired images or used to form a mask which is applied to images.

Voxel Characterization

To use the high resolution data acquired during the steady-state phase of the acquisition, the voxels in the reconstructed image must be segmented so that arteries and veins can be distinguished from each other and from the background tissues. This is done by comparing the signal at each voxel during the time resolved phase of the acquisition with arterial and venous contrast enhancement reference curves. As will be described in detail below, the contrast enhancement reference curves are produced using selected voxels from the time resolved images 301-308. The contrast enhancement reference curves 280 and 282 are produced by averaging the brightness values of the selected arterial and venous voxels in the successive time course images 301-308. These contrast enhancement reference curves 280 and 282 will depend on injection rate, dose volume, anatomic region and the patients health, and therefore must be determined for each exam.

The contrast enhancement reference curves 280 and 282 are produced automatically from the time resolved images 301-308. Two methods for automatically producing the contrast enhancement reference curves 280 and 282 will now be described. With both methods the first step in the process is to divide the field of view of the acquired image into a plurality of regions. In the preferred embodiment the field of view is divided into quadrants. A loop is then entered in which contrast enhancement reference curves 280 and 282 are produced for voxels in each of the four regions according to one of the following two methods.

Figure 10:
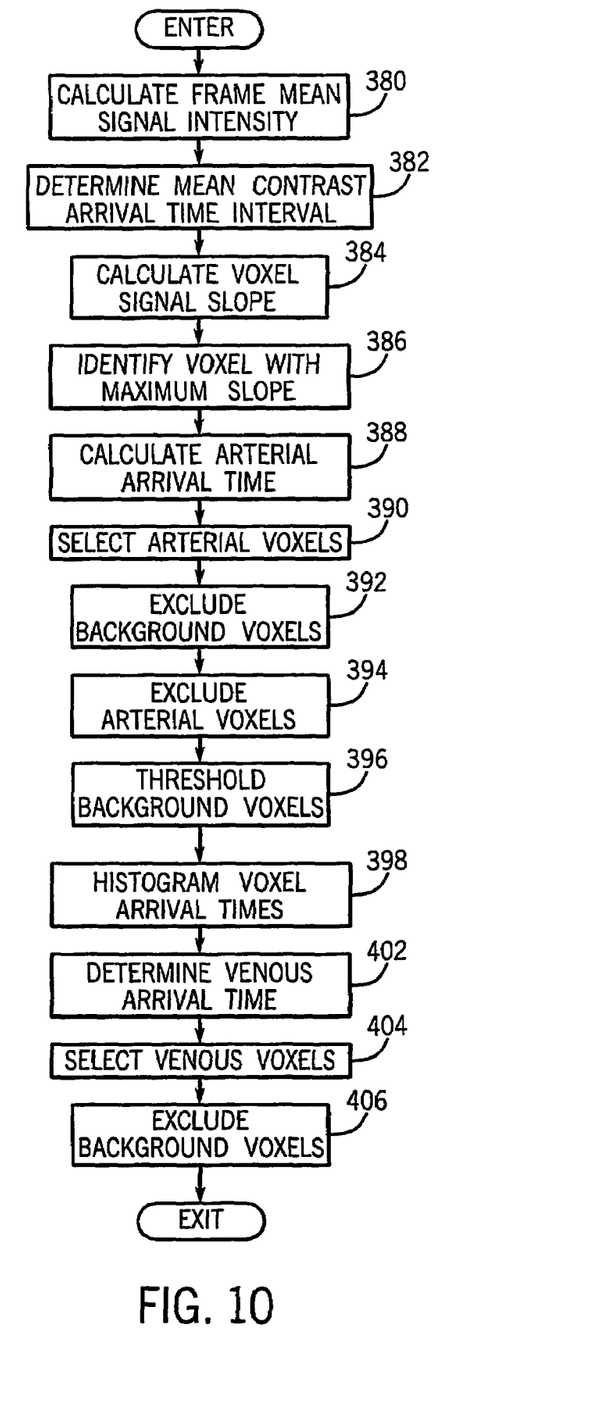
FIG. 10 is a flow chart indicating the steps used to automatically produce reference curves according to another preferred embodiment of the invention.

Referring particularly to FIG. 10, in the first preferred method the first step is to calculate the mean signal value for each acquired image frame as indicated at process block 380. A mean contrast arrival time interval is then determined at process block 382 by locating the image frame with the peak mean signal value and then locating the image frame acquired earlier in time which has a mean signal intensity of a preset percentage of this peak (e.g. 15%). This is the mean contrast arrival time, and the arrival time interval extends over this image frame and the next two image frames.

As indicated at process block 384 the rate of change, or slope, of the signal intensity at each image voxel is then calculated over this arrival time interval. The voxel having the maximum slope is selected at process block 386, and the contrast arrival time for this voxel is calculated at process block 388 by examining its signal magnitude (e.g. 50% of peak magnitude) over the time course series. All image voxels having the same contrast arrival time are then selected as indicated at process block 390. To remove any background voxels from this set of arterial voxels, the standard deviation of each remaining voxel signal is calculated and the peak standard deviation (i.e. the arterial voxel with maximum signal change) is determined. As indicated at process block 392, any voxel signal having less than 70% of this peak standard deviation is excluded as a background pixel. The remaining voxels are considered arterial voxels which may be averaged to calculate the arterial contrast enhancement reference curve 380 for a region.

Referring still to FIG. 10, venous voxels are now identified. The first step as indicated at process block 394 is to exclude from consideration all voxels having a contrast arrival time earlier than the arterial contrast arrival time calculated previously at process block 388. Background pixels are excluded from consideration as indicated at process block 396 using a threshold process. An image acquired prior to contrast arrival is employed to calculate a baseline noise level (σ) and a threshold of 5σ is established and used to exclude background pixels.

Figure 11:
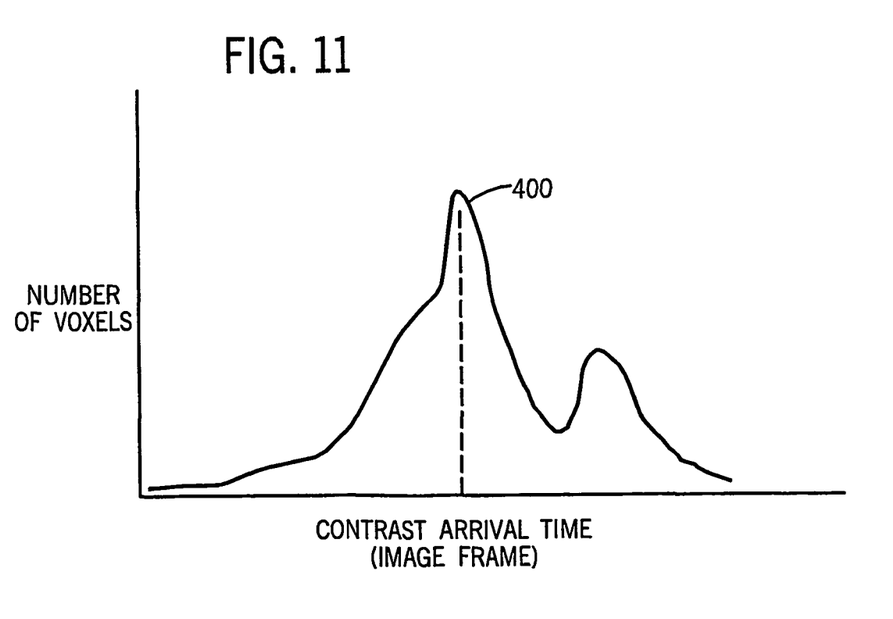
FIG. 11 is a graphic representation of a histogram used to segment venous voxels.

A histogram of the contrast arrival times of each remaining candidate venous voxel is then calculated at process block 398. As illustrated in FIG. 11, the histogram may have more than one peak due to background voxels at points of contrast leakage, but the initial peak 400 is reliably a result of venous voxels. The arrival time at the peak 400 is selected as the venous contrast arrival time as indicated at process block 402, and all candidate voxels with this same arrival time are selected as venous voxels at process block 404. Further background voxels are excluded at process block 406 in the same manner described above by calculating the standard deviation of each candidate venous voxel signal and excluding those voxels with a standard deviation less than 70% of the maximum. The remaining voxels are identified as venous voxels and are averaged to calculate the venous contrast enhancement reference curve 382 for a region.

The above-described automatic process is repeated to calculate the contrast enhancement reference curves 380 and 382 for each of the four regions.

Figure 6:
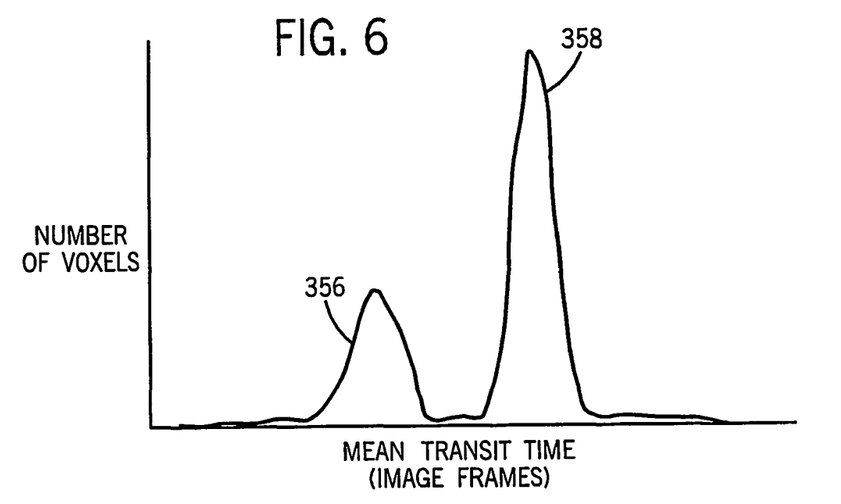
FIG. 6 is a graphic representation of a histogram used to segment arterial and venous voxels.
Figure 9:
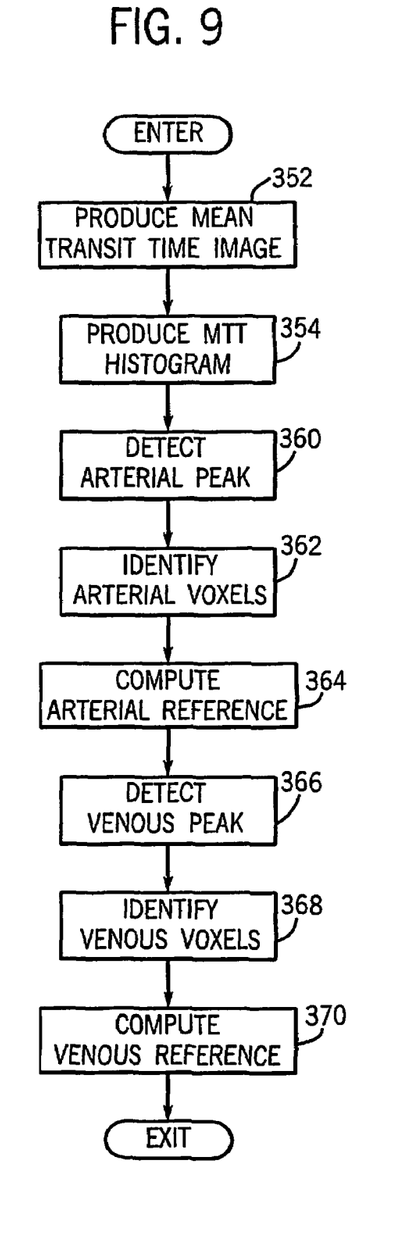
FIG. 9 is a flow chart indicating the steps used to automatically produce reference curves according to one preferred embodiment of the invention.

An alternative method for calculating the contrast enhancement reference curves 380 and 382 is illustrated in FIG. 9. As indicated at process block 352, the first step in this embodiment is to produce a mean transit time image of the voxels in the region. This is done by first eliminating from consideration certain voxels. More specifically, the standard deviation of the signal magnitude is calculated for each voxel. Those voxels having a standard deviation in signal strength greater than 60% of the peak standard deviation are considered to be possible vessels. Those voxels with lower deviations in signal strength are eliminated, or filtered, from consideration. The peak signal strength of each candidate voxel is then located by examining the corresponding voxel signal in each time resolved image. This peak signal time, or image frame number, is stored. As indicated at process block 354, a mean transit time (MTT) histogram is then produced by counting the number of voxels that peak at each image frame time in the series. A graphic representation of such a histogram is shown in FIG. 6 and typically it will have two peaks 356 and 358.

The first peak 356 indicates the mean transit time for contrast agent flowing into arteries and the second peak 358 indicates the mean transit time for veins. As indicated in FIG. 9 at process block 360, the arterial peak 356 in the histogram is detected, and the corresponding mean transit time is used to identify arterial voxels as indicated at process block 362. The signal values for these identified arterial voxels are averaged to form the desired arterial contrast enhancement reference curve 280, as indicated at process block 364.

The venous contrast enhancement reference curve 282 is computed in a similar manner. As indicated at process block 366, the location of the venous peak 358 is detected in the histogram and the identity of venous voxels is determined at process block 368 using the venous peak mean transit time as a key. The signals from the identified venous voxels are averaged to form the venous contrast enhancement reference curve 282, as indicated at process block 370.

The above-described method is repeated to calculate the contrast enhancement reference curves 280 and 282 for each of the four regions.

The automatically produced reference curves are now used to segment the acquired images. The signal changes at each voxel in the time resolved images 301-308 are compared with the contrast enhancement reference curves 380 and 382 to determine if the voxel depicts arterial, venous or background tissue. Those voxel signals which closely follow the arterial reference curve 280 are designated "arterial" and those voxel signals which correlate well with the venous reference signal 282 are designated "venous". This comparison can be performed in a number of different ways. The objective, however, is to measure the degree to which the signals resemble, or match, the reference signals. A number of well known correlation methods can be used or a Sum of Squared Deviations method (SSD) described below may be used.

SSD sums the squared difference between the reference curve and the voxel brightness value, over all the time frames 301-308 acquired during the time-resolved phase of the examination. For a given voxel, $$SSD(voxel) = \sum_{frames} (REF(frame) - Voxel(frame))^2, \quad (1)$$

where REF(frame) is the value of the reference curve for a given image frame, and Voxel(frame) is the signal intensity of the voxel for the same image frame. The size of the SSD value reflects how well the voxels match up with the reference curves. Voxels which match closely to the reference curves will have very small SSD values. Larger SSD values correspond to voxels whose time course brightness does not match the curves. Such voxels usually form part of the background tissues.

A problem with using a single measurement of the SSD value is that some venous voxels will have values which look more like arterial voxels than true arterial voxels and vice versa. This problem is addressed by comparing each image voxel to both the arterial and the venous contrast enhancement reference curves 280 and 282 to obtain two SSD values ($SSD_A$ and $SSD_V$) for each image voxel. The shape of the voxel signal curve is also sensitive to the absolute signal level measured at any voxel. The absolute signal is affected by, among other things, coil sensitivity and vessel size. To account for these differences a scaled version of the voxel signal verses time curve is used. The scaling of the voxel values minimizes the SSD and thus provides an optimal SSD value.

The nature of each voxel in the acquired images can be characterized using the calculated $SSD_A$ and $SSD_V$ values. Those image voxels with $SSD_A$ values lower than a preset amount and lower than their $SSD_V$ value may be characterized as arterial. Similarly, voxels with $SSD_V$ values below a preset amount and lower than their $SSD_A$ value may be characterized as venous. All other voxels may be characterized as background tissues.

Rather than simply removing background from an arterial and/or venous MRA image, which gives the image an artificial look, the signal value of the unwanted background voxels may be suppressed by a weighting factor which ranges from 0 to 1. This gives the image a much more aesthetic look. The $SSD_A$ and $SSD_V$ values are used to calculate these weights. The preferred embodiment determines a weight factor based upon the voxel's "distance" in a 2D ($SSD_A$, $SSD_V$) plane, from minimum calculated $SSD_A$ and $SSD_V$ values for the exam:

$$D(pixel) = \sqrt{(SSD_A(pixel) - SSD_A(MIN))^2 + (SSD_V(pixel) - SSD_V(MIN))^2} \quad (2)$$

where:
$SSD_A$ (voxel)=$SSD_A$ for the subject voxel;
$SSD_V$ (voxel)=$SSD_V$ for the subject voxel;

SSD$_A$(MIN)=lowest SSD$_A$ of any voxel in the images 301-308;

SSD$_V$(MIN)=lowest SSD$_V$ of any voxel in the images 301-308.

The distance (D) then is used to define a weight for each image voxel which is calculated analytically for each exam or which is rapidly determined by using a lookup table of previously calculated values.

Image Reconstruction

A number of different images may be constructed from the acquired NMR data and the voxel characterization information. Two preferred image reconstructions will now be described, but others are also possible. The first preferred embodiment is a method for reconstructing a single, high resolution and low noise image of the chosen vasculature (i.e. arteries, veins, or both arteries and veins). The second preferred embodiment is a method for reconstructing an enhanced set of time course image frames which depict the arrival of the contrast bolus in the subject vasculature.

Single Image

Figure 7:
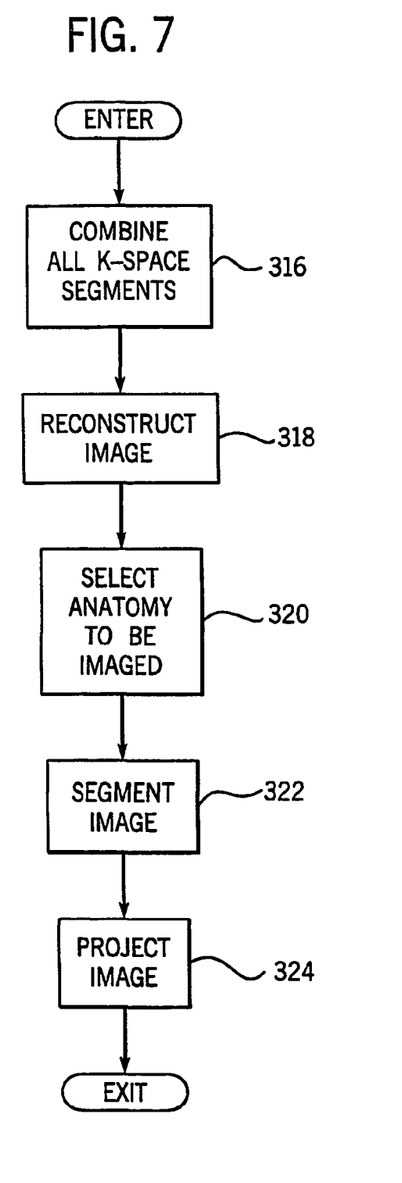
FIG. 7 is a flow chart indicating the steps used to practice the preferred embodiment of the invention.

The objective of this method is to produce a single high quality image by combining all of the NMR data acquired during the two phases of the scan. Referring particularly to FIG. 7, the first step is to combine all the acquired k-space data segments into a single 3D k-space data set as indicated at process block 316. This combination can be as simple as the average value of each k-space sample in corresponding segments A-F. The greater the number of k-space samples in this average, the higher the SNR of the reconstructed image.

The k-space samples from each acquired segment can also be combined in a weighted average. During data acquisition the various k-space segments are weighted by the contrast present at the time of their acquisition. For example, suppose A, B and C are three acquired k-space segments. For purposes of illustration we assume that a total of i A segments, j B segments and k C segments are acquired, the simplest composite image would be formed by averaging the various A, B and C segments separately prior to reconstruction. A better method is to form a matched filter in which each segment is weighted in proportion to the detected signal. Each detected A segment is related to the actual k-space segment A by the relationship $A_i = c_i A'$ where the subscripts refer to the time ordering of the various acquired A segments. The matched filter would further weight each A segment by ci. The sum of weighted A segments would be normalized by dividing by the sum of the weighting coefficients used. The overall matched filter sum would be given by $$I = \frac{\sum_i c_i(t) A_i(t)}{\sum_i c_i(t)} + \frac{\sum_j c_j(t) B_j(t)}{\sum_j c_j(t)} + \frac{\sum_k c_k(t) C_k(t)}{\sum_k c_k(t)}$$

$$= \frac{\sum_i c_i^2(t) A'}{\sum_i c_i(t)} + \frac{\sum_j c_j^2(t) B'}{\sum_j c_j(t)} + \frac{\sum_k c_k^2(t) C'}{\sum_k c_k(t)}$$

It is also possible to generate a reweighted image in which the k-space filter caused by the contrast curve is removed in an attempt to increase spatial resolution at the possible expense of boosting high spatial frequency noise. This reweighted image is formed by multiplying the matched filter sums for each k space segment by an appropriate factor. It can be seen from the equation above that, for example, the A' portion of k-space in the matched filter sum is weighted by $$\frac{\sum_i c_i^2(t)}{\sum_i c_i(t)}$$

Therefore, each matched filter segment sums must be divided by this factor to completely remove contrast weighting. This results in a final matched filtered, re-weighted image given by $$I_{RW} = \frac{\sum_i c_i(t) A_i(t)}{\sum_i c_i^2(t)} + \frac{\sum_j c_j(t) B_j(t)}{\sum_j c_j^2(t)} + \frac{\sum_k c_k(t) C_k(t)}{\sum_k c_k^2(t)}$$

This formula can be generalized to include a number of k-space segments. In addition, the weighted average for each segment A-F can be reweighted as described in U.S. Pat. No. 5,881,728, issued Mar. 16, 1999 to account for changes in contrast enhancement during the scan.

As indicated at process block 318, the next step is to reconstruct an image from the combined k-space data set. This is a three-dimensional Fourier transformation followed by the calculation of the magnitude of each voxel in the image from its complex I and Q components. The operator then selects the object to be displayed in this image, the arteries, the veins, or both as indicated at process block 320.

As indicated at process block 322, the next step is to segment the 3D image. This is accomplished using the voxel characterization information described above and it can be done in two ways. First, the undesired structures can be totally eliminated from the image by forming a binary mask having bits corresponding to the image voxels. The voxel characterization information is used to set the mask bits to either "1" or "0" depending on whether the corresponding voxel is characterized as artery, vein or background. For example, if arteries are to be displayed, the mask bits characterized as artery are set to "1" and the remaining bits are set to "0". The voxel values in the combined 3D image are multiplied by their corresponding mask bits to produce the desired segmented 3D image.

Instead of totally masking out background voxels, it is also possible to segment the image by applying the weighting factors (D) calculated above to corresponding voxels in the combined 3D image. Rather than multiplying each background voxel by "0" and rendering it black, therefore, each background voxel is reduced in brightness by an amount determined by its weighting factor (D).

For assessing overall blood vessel structure and health it is usually more useful to project the 3D array of image data into a single 2D projection image as indicated at process block 324. The most commonly used technique for doing this is to project a ray from each voxel in the projection image through the 3D array of image data points and select the data point which has the maximum value. The value selected for each ray is used to control the brightness of its corresponding voxel in the 2D projection image. This method, referred to as the "maximum voxel technique," is very easy to implement and it gives aesthetically pleasing images.

Another technique which is used to form a 2D projection image and which retains more of the available information is what is referred to as the "integration method". This projection method is described in U.S. Pat. No. 5,204,627 entitled "Adaptive NMR Angiographic Projection Method" and is incorporated herein by reference. With this method the brightness of each projection image voxel is determined by the sum of all the data points along the projection ray.

Time Course Image Frames

The NMR data acquired during the steady-state phase of the scan can also be used to improve the quality of the image frames 301-308 acquired during the time-resolved phase. These enhanced time course images can be viewed in sequence to observe the arrival of the contrast bolus in the vasculature.

Figure 8:
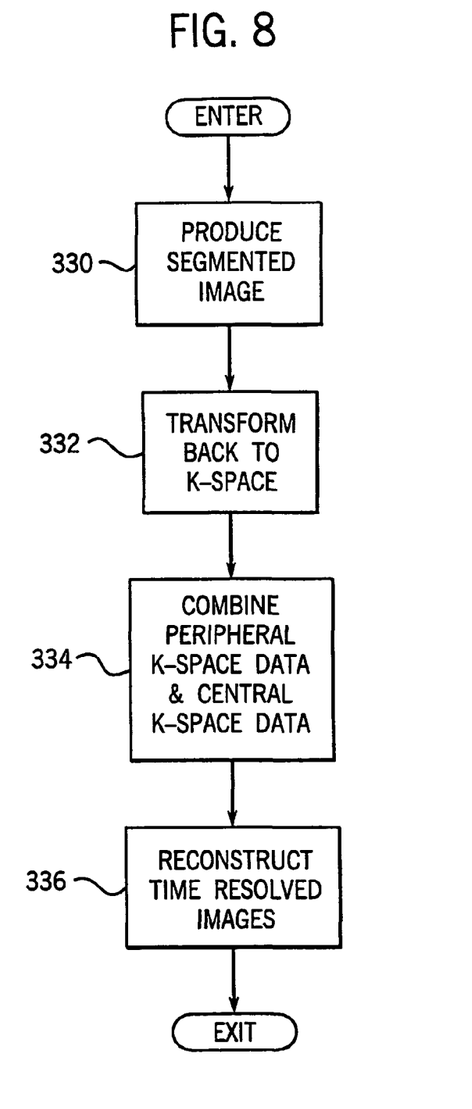
FIG. 8 is a flow chart indicating the steps used to practice an alternative embodiment of the invention.

Referring to FIG. 8, the first step is to produce a segmented image using only k-space data segments acquired during the steady-state phase of the scan as indicated at process block 330. This segmented image is produced in the same manner described above for the single image reconstruction, but no time-resolved data segments are used. This segmented image is Fourier transformed back to k-space as indicated at process block 332 and the peripheral k-space segments from the resulting k-space data set are selected out and combined with the central k-space segments acquired during the time resolved phase as indicated at process block 334. That is, the segmented k-space data for peripheral segments D, E and F are combined with the time course k-space data segments A, B and C. The enhanced time course images are reconstructed from this combined k-space data by performing a 3D Fourier transformation as indicated at process block 336.

We claim:

1. A method for producing a magnetic resonance angiogram of a patient using an MRI system, the steps comprising:
   a) injecting the patient with a contrast agent which flows into a region of interest in the patient;
   b) acquiring NMR image data for a series of NMR time course data sets during a time resolved phase of an examination, during which the contrast agent makes a first passage through the patient's arteries in the region of interest;
   c) reconstructing a corresponding series of image frames depicting NMR signal magnitude in an array of voxels during the first passage of contrast agent;
   d) calculating a plurality of arterial contrast enhancement reference curves by:
      i) dividing the array of voxels into a plurality of regions;
      ii) identifying a set of arterial voxels in each region; and
      iii) computing an arterial contrast enhancement reference curve for each region by averaging the signals from identified arterial voxels therein; and
   e) producing the magnetic resonance angiogram from the acquired NMR image data by segmenting arteries in each region of the angiogram using information contained in the series of NMR time course images and the calculated arterial contrast enhancement curve for the corresponding region.

2. The method as recited in claim 1 in which the arterial voxels are identified in step d) ii) by:
   producing a mean transit time histogram which indicates the number of image voxel signals that reach a peak magnitude at each time interval during the time resolved phase of the examination;
   and identifying arterial voxels using information in the mean transit time histogram.

3. The method as recited in claim 2 in which step d) ii) includes locating an arterial peak in the mean transit time histogram and identifying image voxels which have a peak signal at the mean transit time corresponding to this arterial peak.

4. The method as recited in claim 2 which includes eliminating from the mean transit time histogram image voxels whose signal magnitude does not vary significantly in magnitude during the time resolved phase of the examination.

5. The method as recited in claim 2 in step e) is performed by comparing image voxel signals with the arterial enhancement reference curve.

6. The method as recited in claim 2 which includes producing from the NMR time course images a venous contrast enhancement reference curve for each region that indicates the signal enhancement of image voxels depicting veins during the time resolved phase of the examination, and the segmenting of each region in step e) employs the corresponding venous enhancement reference curve to segment veins.

7. The method as recited in claim 6 in which each venous contrast enhancement reference curve is computed by:
   identifying venous voxels in the region using information in the mean transit time histogram;
   and computing the venous contrast enhancement reference curve by averaging the signals from identified venous voxels.

8. The method as recited in claim 7 which includes locating a venous peak in the mean transit time histogram and identifying image voxels which have a peak signal at the mean transit time corresponding to this venous peak.

9. The method as recited in claim 1 in which the arterial voxels are identified in step d) ii) by:
   calculating an arterial contrast arrival time from data in the time course data sets;
   and calculating a contrast arrival time for each voxel; and
   selecting as arterial voxels, those voxels which have a contrast arrival time substantially the same as the arterial contrast arrival time.

10. The method as recited in claim 9 in which the arterial contrast arrival time is calculated by:
    determining from the time course data sets a mean contrast arrival time interval;
    calculating the slope of each voxel signal during the mean contrast arrival time interval;
    identifying a voxel with the maximum signal slope; and
    calculating the contrast arrival time for the identified voxel.

11. The method as recited in claim 1 in which background voxels are excluded from the set of arterial voxels identified in step d) ii) by:
    calculating the standard deviation of voxel signals; determining the maximum standard deviation of the voxel signals;
    and excluding voxels having signals with a standard deviation less than a preset percentage of the maximum standard deviation.

12. The method as recited in claim 1 which includes producing from the NMR time course images a venous contrast enhancement reference curve for each region that indicates the signal enhancement of image voxels depicting veins during the time resolved phase of the examination, and the segmenting of each region in step e) employs the corresponding venous enhancement reference curve to segment veins.

13. The method as recited in claim 12 in which each venous enhancement reference curve is computed by:
    identifying venous voxels in the region using information in the time course data sets;
    and computing the venous contrast enhancement curve by averaging the signals from identified venous voxels.

14. The method as recited in claim 13 in which the venous voxels are identified by:
   calculating the contrast arrival time at each of a plurality of candidate voxels; producing a histogram of the calculated contrast arrival times;
   determining venous contrast arrival time from a peak in the histogram;
   and selecting a set of venous voxels as those which have a contrast arrival time substantially the same as the venous arrival time.

15. The method as recited in claim 14 in which background voxels are excluded from the set of venous voxels by:
   calculating the standard deviation of voxel signals;
   determining the maximum standard deviation of the voxel signals;
   and excluding voxels having a signal with a standard deviation less than a preset percentage of the maximum standard deviation.

16. The method as recited in claim 14 in which background voxels are excluded from the plurality of candidate voxels by:
   establishing a voxel signal threshold level;
   and excluding voxels whose signals do not exceed the signal threshold level.

\* \* \* \* \*

UNITED STATES PATENT AND TRADEMARK OFFICE
CERTIFICATE OF CORRECTION

PATENT NO. : 7,583,992 B2  Page 1 of 1
APPLICATION NO. : 10/485433
DATED : September 1, 2009
INVENTOR(S) : Mistretta et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 55 days.

Signed and Sealed this

Fourteenth Day of December, 2010

David J. Kappos
*Director of the United States Patent and Trademark Office*